United States Patent [19]
Diller

[11] Patent Number: 4,459,553
[45] Date of Patent: Jul. 10, 1984

[54] D.C. STABILIZATION CIRCUIT FOR A FOLLOWER-TYPE AMPLIFIER
[75] Inventor: Calvin D. Diller, Beaverton, Oreg.
[73] Assignee: Tektronix, Inc., Beaverton, Oreg.
[21] Appl. No.: 347,837
[22] Filed: Feb. 11, 1982
[51] Int. Cl.³ .............................................. H03F 1/32
[52] U.S. Cl. ..................................... 330/85; 330/149; 330/290; 330/293; 330/300
[58] Field of Search ................. 330/85, 149, 277, 290, 330/293, 300, 302

[56] References Cited
U.S. PATENT DOCUMENTS
3,676,790  7/1972  Beurrier .......................... 330/149 X Primary Examiner—James B. Mullins
Attorney, Agent, or Firm—George T. Noe

[57] ABSTRACT

A D.C. stabilization circuit is provided for a follower-type amplifier in which a correction current is generated to maintain a constant operating point of the follower device. A blocking capacitor between a signal source and the follower device permits the bias voltage to self adjust. In a preferred embodiment, the correction current is generated by a transconductance amplifier which compares the output voltage with a signal input voltage, and the correction current is connected directly to the junction of the blocking capacitor and the input of the follower device. The follower device may suitably be a field-effect transistor, a bipolar transistor, or a multi-stage follower composed of both types of devices.

3 Claims, 3 Drawing Figures

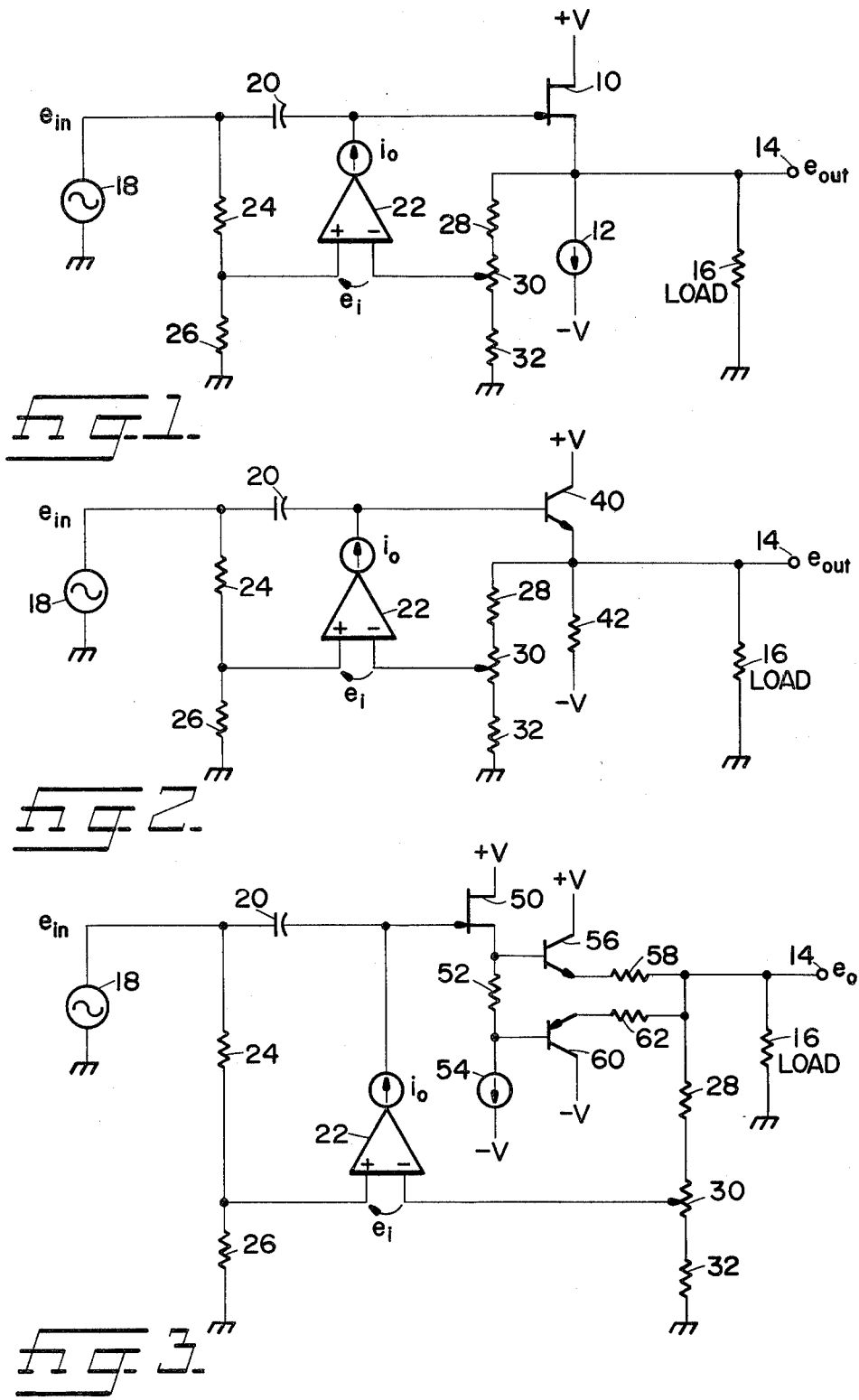

D.C. STABILIZATION CIRCUIT FOR A FOLLOWER-TYPE AMPLIFIER

BACKGROUND OF THE INVENTION

Follower-type amplifiers are widely used in electronic signal processing circuits, particularly in impedance matching or signal buffering situations. Such follower-type amplifiers, also known as emitter followers, FET source followers, voltage followers, etc., are typically used as the signal input stage for electronic test and measurement instruments, such as oscilloscopes and the like. In the implementation of follower-type amplifiers as input stages, where precise signal replication may be required over a wide frequency range, e.g., from D.C. to a few hundred megahertz, amplifier drift characteristics must be compensated. That is, amplifier stabilization must be provided for performance at the lower frequencies, particularly at or near D.C.

To solve the drift or stabilization problems, many solutions have been offered in which the correction or compensation is attempted on the output side of a particular active device. For example, it is a common practice with field-effect transistor (FET) source follower circuits to provide a second FET with matched characteristics as a current source or a current sink, the effect being that the drift producing mechanisms of the two FETs cancel each other, providing a stabilized output. Such a circuit, however, has a fairly high output impedance, e.g., about 150 ohms, and is subject to thermal drift. The problem increases in complexity when bipolar transistors are added to reduce the output impedance or to provide compensation because of their differing operating characteristics. Here, the attempted solution is to control the FET operating bias by adding an operational amplifier to control the current source or current sink transistor. However, this scheme has its drawbacks as well, causing shifting bias levels throughout the circuit and perhaps any subsequent following stages. It is also difficult to maintain zero D.C. offset from input to output.

Another attempt to solve the stabilization problem involved an operational amplifier which compared the follower output with the input and provided a corrective current through a resistor to the base of the follower transistor. The drawback with this system is that the follower device is fast-acting on high-speed signal transitions while the response of the operational amplifier is slow in the sense that the correction current causes a voltage drop across the aforementioned resistor, causing a shift in the bias conditions of the follower device.

SUMMARY OF THE INVENTION

In accordance with the present invention, a D.C. stabilization circuit is provided for follower-type amplifiers, specifically FET source follower and bipolar transistor emitter follower amplifiers. The input of the follower device is AC coupled to an input signal source via a coupling capacitor to provide high-frequency operation. For lower frequency operation, and at DC, a transconductance amplifier compares the follower stage output with the input and provides whatever current is required to drive the input capacitance and leakage of the follower device to provide a constant operating point of the follower device. A pair of voltage dividers—one across the signal source and one across the output load—provides voltage samples to the respective inputs of the transconductance amplifier to permit the output-to-input comparison to be made.

It is therefore one object of the present invention to provide a D.C. stabilization circuit for follower-type amplifiers in which low frequency correction current is applied directly to the input terminal of the follower device to maintain constant operating characteristics thereof.

It is a feature of the present invention to provide a D.C. stabilized follower-type amplifier capable of driving subsequent stages where bias levels must be kept constant.

It is another feature of the present invention to provide a D.C. stabilized follower-type amplifier having zero D.C. offset from input to output over a wide range of signal frequencies.

Other objects, features, and advantages of the present invention will become apparent to those skilled in the art upon a reading of the following description when taken in conjunction with the accompanying drawings.

BRIEF DESCRIPTION OF THE DRAWINGS

FIG. 1 is a schematic of a D.C. stabilized FET source follower in accordance with the present invention;

FIG. 2 is a schematic of a D.C. stabilized bipolar transistor emitter follower in accordance with the present invention; and FIG. 3 is a schematic of a D.C. stabilized follower-type amplifier employing both FET and bipolar devices in which bias of the bipolar devices is set independent of the FET characteristics.

DETAILED DESCRIPTION OF THE INVENTION

Referring now to FIG. 1, there is shown a field-effect transistor (FET) 10 having its drain connected to a suitable positive supply voltage +V and its source connected via an operating-bias current source 12 to a suitable negative supply voltage −V. Also connected to the source of FET 10 is an output terminal 14 and a load resistor 16 to ground. The gate of FET 10 is connected to a signal source, shown as a signal generator 18, via a coupling capacitor 20. Thus far described is an AC-coupled FET source follower capable of precise signal replication at fairly high frequencies, for example, up to several hundred megahertz.

For lower-frequency operation, and at D.C., a transconductance amplifier 22 compares the follower stage output with the input and provides the amount of current necessary to drive the input capacitance and leakage of the FET thereby to maintain a constant gate-to-source voltage thereof. A first voltage divider is disposed across the voltage generator 18 and comprises resistors 24 and 26 connected in series to ground. The non-inverting input of transconductance amplifier 22 is connected to the junction of resistors 24 and 26. A second voltage divider is connected across the load in parallel with resistor 16, and comprises resistors 28, 30, and 32 connected in series to ground. The inverting input of transconductance amplifier 22 is connected to the wiper arm of resistor 30, which may actually be a potentiometer. Transconductance amplifier 22 may suitably be a monolithic operational transconductance amplifier, such as a commercially-available CA 3080 type, the output current $i_o$ of which is proportional to the voltage $e_i$ across the inverting and non-inverting inputs. This device typically has high input and output impedances, and thus results in very little loading of the FET gate circuit. In certain circumstances, a transconductance amplifier may be effected by using a conventional operational amplifier, the output of which is connected to a current source or current sink transistor to provide the required current. It is important that no resistive element be included that will result in voltage shift.

At the higher frequencies, the output signal $e_{out}$ replicates the input signal $e_{in}$. FET follower 10 has a gain of close to, but less than unity, so there is not a precise voltage match. However, potentiometer 30 allows the amplitude proportion of $e_{out}$ to $e_{in}$ to remain constant over the entire frequency range from D.C. to the upper frequency limit. As the frequency of the input signal is reduced, the capacitive reactance of capacitor 20 drops and the output amplitude would tend to drop because of the D.C. blocking effect of the capacitor. However, the error is sensed by transconductance amplifier 22, which provides the current drive at the FET gate to maintain the correct output amplitude. Thus the FET governs the high frequency performance of the follower amplifier, while the transconductance amplifier mandates the D.C. performance. The value of capacitor 20 is chosen so that the two operating regimes overlap in frequency by several octaves, at least. Also, because capacitor 20 is essentially a D.C. blocking capacitor, the quiescent voltage output terminal 14 may be set to precisely zero volts D.C. (i.e., up to ±100 microvolts in a typical implementation), irrespective of the actual gate voltage, to match the zero D.C. input voltage at the junction of signal generator 18 and capacitor 20. For step functions, the response of the transconductance amplifier in delivering (or removing) current to the coupling capacitor is immediate so that constant operating parameters are maintained, e.g., constant gate-to-source voltage.

FIG. 2 shows a circuit similar to that of FIG. 1 and therefore like reference numerals are used for components described hereinabove; however, the follower device is a bipolar transistor 40 and its associated emitter biasing resistor 42. The point here is to illustrate that the stabilization circuit may work well for either FET source followers or bipolar transistor emitter followers, since the operating bias of the active follower device is not affected directly by the corrective mechanism. Furthermore, capacitor 20 permits the transistor base or FET gate to self-adjust to the voltage level required by the device for proper biasing, since the D.C. stabilization circuit permits the voltage level of $e_{out}$ to match that of $e_{in}$ at D.C.

The present invention permits a follower-type amplifier to be fabricated in stages to take advantage of the very high input impedance offered by an FET and the very low output impedance offered by a bipolar transistor. Such a circuit is shown in FIG. 3, wherein like reference numerals again are used for circuit components described hereinabove. An FET 50 has its gate connected to capacitor 20, its drain connected to the positive supply +V, and its source connected through a resistor 52 and current sink 54 to the negative supply −V. A first bipolar transistor 56 of the NPN conductivity type has its base connected to the source of FET 50, and its emitter connected through a resistor 58 to the output terminal 14. A second bipolar transistor 60 of the PNP conductivity type has its base connected to the junction of resistor 52 and current sink 54, and its emitter connected through a resistor 62 to output terminal 14. With both conductivity type bipolar transistors connected in complementary fashion, the follower performs equally well for large transitions of either polarity. For driving a low-impedance load, e.g., the value of resistor 16 being typically 250 ohms, resistors 58 and 62 may be chosen to have a low resistance value such as 20 ohms without significant degradation of the output signal. Of course, some attenuation will occur; however, the amplitude proportionality of $e_{out}$ to $e_{in}$ remains constant and therefore the signal is faithfully replicated and may be further amplified or attenuated in subsequent processing circuits, depending on the intended purpose. The biasing of FET 50 and transistors 56 and 60 remains independent of the D.C. stabilization circuit, and moreover, the bias of the bipolar transistors may be established independent of the FET characteristics.

In situations in which the load impedance shifts, or is susceptible to shifting or changing, the voltage divider string comprising resistors 28, 30, and 32 may be disconnected from output terminal 14 and reconnected to the emitters of transistors 56 and 60 through a pair of pick-off resistors in parallel with resistors 58 and 62. This circuit modification somewhat insulates the inverting input of transconductance amplifier 22 from the voltage division effect of resistors 58–62 and 16 caused by changes in the load impedance.

As can be seen, the D.C. stabilization in accordance with the present invention may be implemented simply and comparatively inexpensively, and permits optimization of high speed and D.C. parameters of follower-type amplifiers.

It will be obvious to those having ordinary skill in the art that many changes may be made in the details of the above described preferred embodiments of the invention without departing from the spirit of the invention in its broader aspects. For example, while in FIG. 3 two bipolar transistors are shown, a follower-type amplifier comprising an FET and single bipolar transistor could be implemented with attendant reduction in performance. Therefore, the scope of the present invention should be determined by the following claims.

What I claim as being novel is:

1. A D.C. stabilization circuit for a follower-type amplifier, comprising:
    a signal input terminal;
    voltage follower means having an input and an output, the output thereof being connectable to a load;
    a capacitor having one end coupled to said signal input terminal and the other end thereof directly connected to said input of said voltage follower means;
    means coupled to said signal input terminal and said voltage follower output for detecting a voltage difference therebetween and for generating a correction current in response thereto; and
    means for directly connecting said correction current to the input of said voltage follower means.

2. A D.C. stabilization circuit in accordance with claim 1 wherein said voltage-difference detecting means and said correction-current generating means comprises a transconductance amplifier having a pair of voltage input terminals and a current output terminal.

3. A D.C. stabilization circuit in accordance with claim 2 further comprising a first voltage divider connected from signal input terminal to a predetermined reference and a second voltage divider connected from said output of said voltage follower means to said predetermined reference, wherein the aforementioned pair of voltage input terminals of said transconductance amplifier are connected respectively to said first and second voltage dividers.

* * * * *